(12) United States Patent
Seok et al.

(10) Patent No.: US 9,755,383 B2
(45) Date of Patent: *Sep. 5, 2017

(54) ELECTRONIC CONTROL APPARATUS FOR VEHICLE

(71) Applicant: HYUNDAI AUTRON CO., LTD., Seongnam-si (KR)

(72) Inventors: Man Ho Seok, Seongnam-si (KR); Wan Kyu Lee, Yongin-si (KR)

(73) Assignee: HYUNDAI AUTRON CO., LTD., Seongnam-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/937,122

(22) Filed: Nov. 10, 2015

(65) Prior Publication Data

US 2016/0135306 A1 May 12, 2016

(30) Foreign Application Priority Data

Nov. 12, 2014 (KR) ........................ 10-2014-0157117

(51) Int. Cl.
*H05K 5/00* (2006.01)
*H01R 24/66* (2011.01)
*H01R 12/72* (2011.01)

(52) U.S. Cl.
CPC ........... *H01R 24/66* (2013.01); *H01R 12/724* (2013.01); *H05K 5/0069* (2013.01); *H01R 2201/26* (2013.01)

(58) Field of Classification Search
USPC ................................................ 361/752, 748
See application file for complete search history.

(56) References Cited

U.S. PATENT DOCUMENTS

2006/0046535 A1   3/2006   Iida
2014/0321079 A1*  10/2014  Kim ..................... H05K 5/0039
                                                       361/752

FOREIGN PATENT DOCUMENTS

JP        H07-003162 U        1/1995

OTHER PUBLICATIONS

Korean Intellectual Property Office, Office Action for Korean patent application No. 10-2014-0157117, Oct. 1, 2015, Korea.
Office Action for Chinese Patent Application No. 201510738759.4, dated Jun. 9, 2017, State Intellectual Property Office of the People's Republic of China, China.

* cited by examiner

*Primary Examiner* — Andargie M Aychillhum
(74) *Attorney, Agent, or Firm* — Mayer Brown LLP; Hyunho Park

(57) ABSTRACT

The present specification relates to an electronic control apparatus for a vehicle, and the electronic control apparatus for a vehicle according to the present specification includes: an electronic control board which electrically controls respective parts in the vehicle; a connector which is electrically connected with the electronic control board; and a housing which is provided with a cover and a base in order to accommodate the electronic control board, in which the cover includes an upper support portion which supports an upper portion of the connector, and the base includes a lower support portion which supports a lower portion of the connector.

7 Claims, 3 Drawing Sheets

ELECTRONIC CONTROL APPARATUS FOR VEHICLE

CROSS-REFERENCE TO RELATED APPLICATIONS

This application claims priority to and the benefit of Korean Patent Application No. 10-2014-0157117 filed in the Korean Intellectual Property Office on Nov. 12, 2014, the entire contents of which are incorporated herein by reference.

TECHNICAL FIELD

The present specification relates to an electronic control apparatus for a vehicle, and more particularly, to an electronic control apparatus capable of preventing damage and improving stability by supporting a connector in the electronic control apparatus without using an adhesive or a screw.

BACKGROUND ART

In general, an electronic control apparatus (electronic control unit (ECU)), which electronically controls various types of devices, is mounted in a vehicle. The electronic control apparatus receives information from sensors or switches that are installed at respective locations of the vehicle. The electronic control apparatus serves to process the received information, and perform various types of electronic control in order to improve ride quality and safety of the vehicle, or provide various types of convenience to a driver and an occupant.

Specifically, the electronic control apparatus controls states of an engine, an automatic transmission, and an anti-lock brake system (ABS) of the vehicle by using a computer. In addition, with the development of performance of the vehicle and the computer, the electronic control apparatus serves to control all parts in the vehicle such as a driving system, a braking system, and a steering system in addition to the automatic transmission.

FIG. 1 is a cross-sectional view of a general electronic control apparatus for a vehicle.

As illustrated in FIG. 1, an electronic control apparatus 100 has a structure that includes a case which includes a cover 130 at an upper side and a base 140 at a lower side, an electronic control board 110 such as a printed circuit board (PCB) which is accommodated in the case, and a connector 120 which is coupled to a front end of the electronic control board 110 so as to be connected with an external socket.

The cover 130 and the base 140 are constructed to be assembled together while covering the electronic control board 110. In particular, the connector 120, which is interposed between the cover 130 and the base 140 when the cover 130 and the base 140 are assembled, forms a sealing structure with the cover 130 side and the base 140 side.

A heat generating element is configured on an upper surface of the electronic control board 110, and a heat radiating paste may be attached to a lower surface of the electronic control board 110. Further, the cover 130 and the base 140 are fastened in a screw manner.

The electronic control apparatus 100 has a high-degree integrated control circuit means. Therefore, the electronic control apparatus 100 requires a predetermined sealing structure that may prevent moisture or foreign substances from flowing into the electronic control apparatus from the outside. In general, in the case of the electronic control apparatus 100, the cover 130 and the base 140 are assembled together with the connector 120 in a state in which a sealing agent is inserted into coupling portions between the cover 130, the base 140, and the connector 120. Therefore, the electronic control board 110 in the electronic control apparatus 100 is protected.

Meanwhile, the electronic control apparatus 100, which uses a press as a cover, is constructed to use an adhesive for applying a waterproof housing and prevent the connector 120 from being pushed. Otherwise, a general non-waterproof electronic control apparatus 100 fixes the connector 120 to the electronic control board 110 by means of a screw 121.

Here, in a case in which a socket, a plug, or the like is connected to or separated from the connector 120 by excessive force, there is concern that the electronic control board 110 will be damaged. In addition, in the case of a structure coupled in a screw manner, the coupling structure of the screw 121 may be loosened. In a case in which a plurality of connectors 120 is used, the amount of adhesive to be used may be increased or the number of application points at which the screws 121 are coupled may be increased. As a result, there are drawbacks in that a process of assembling the electronic control apparatus 100 is complicated, and process costs and material costs are increased. That is, because the cover 130 and the base 140 are coupled by a large number of screws 121, a production cost is increased, and a manufacturing process is inefficient.

In a case in which a coupling relationship between the cover 130 and the base 140 of the housing is loosened or a crack is formed in a coupling portion, an internal circuit in the electronic control apparatus 100 may be damaged due to an inflow of moisture. In this case, there is a problem in that an abnormal operation may occur when the vehicle is operated.

Meanwhile, because the electronic control apparatus 100 is mounted in the vehicle, there is concern that the housing will be damaged due to external impact caused in accordance with an operating state or environment of the vehicle. In a case in which the cover 130 of the housing is dented by the external impact applied to an upper portion of the electronic control apparatus 100, the cover 130 of the housing may come into contact with a leg of an inner pin of the connector 120, and as a result, a short-circuit may occur. Further, fire may occur due to the short-circuit.

SUMMARY OF THE INVENTION

The exemplary embodiments of the present specification have been made in an effort to provide an electronic control apparatus for a vehicle, in which an upper portion and a lower portion of a connector are supported by support portions of a cover and a base, respectively, such that the connector is supported without using an adhesive or a screw, thereby preventing damage to the connector and improving stability.

The exemplary embodiments of the present specification have also been made in an effort to provide an electronic control apparatus for a vehicle, which uses support portions to prevent a cover from being bent inward even though a housing is damaged due to external impact, thereby preventing a fire caused by a short-circuit from inner pins of the connector.

An exemplary embodiment of the present invention provides an electronic control apparatus for a vehicle, including: an electronic control board which electrically controls respective parts in the vehicle; a connector which is electrically connected with the electronic control board; and a housing which is provided with a cover and a base in order to accommodate the electronic control board, in which the cover includes an upper support portion which supports an upper portion of the connector, and the base includes a lower support portion which supports a lower portion of the connector.

The upper support portion may be formed integrally with the cover so as to protrude inward from the cover.

The upper support portion may protrude to have a curved surface so as to have a drawing shape in which the upper support portion is in direct contact with the upper portion of the connector.

The upper support portion may have a first curved surface and a second curved surface which are positioned at both sides based on a vertical surface perpendicular to a direction in which the upper portion of the connector is inserted, the first curved surface being positioned at one side so as to be in direct contact with a front surface into which the upper portion of the connector is inserted, and the second curved surface being positioned at the other side so as to be connected with the first curved surface, and an angle between the vertical surface and the second curved surface may be greater than an angle between the vertical surface and the first curved surface.

The lower support portion may be formed to extend from the base so as to support a lower end of the connector.

The lower support portion may be formed to be in direct contact with a lower protruding portion of the connector, which protrudes in a direction of the electronic control board.

An edge surface of the lower support portion, which is in direct contact with the lower protruding portion of the connector, may be rounded.

According to the exemplary embodiments of the present specification, the upper portion and the lower portion of the connector are supported by the support portions of the cover and the base, respectively, and as a result, it is possible to disperse stress to the housing, which is generated when a socket, a plug or the like is connected to or separated from the connector, thereby protecting the electronic control board.

According to the exemplary embodiments of the present specification, it is possible to support the upper portion and the lower portion of the connector without using an adhesive or a screw, thereby preventing damage to the connector, and improving stability.

According to the exemplary embodiments of the present specification, it is possible to simplify an assembling process, and reduce process costs and material costs.

According to the exemplary embodiments of the present specification, it is possible to uses the support portions to prevent the cover from being bent inward even though the housing is damaged due to external impact, thereby preventing a fire caused by a short-circuit from the inner pins of the connector.

The foregoing summary is illustrative only and is not intended to be in any way limiting. In addition to the illustrative aspects, embodiments, and features described above, further aspects, embodiments, and features will become apparent by reference to the drawings and the following detailed description.

Figure 1:
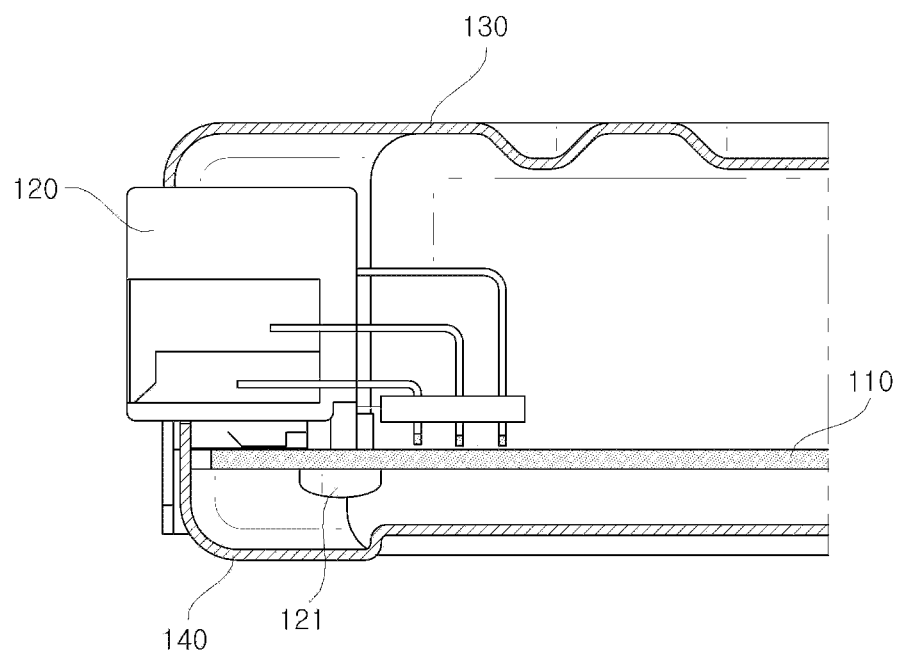
FIG. 1 is a cross-sectional view of a general electronic control apparatus for a vehicle.

It should be understood that the appended drawings are not necessarily to scale, presenting a somewhat simplified representation of various features illustrative of the basic principles of the invention. The specific design features of the present invention as disclosed herein, including, for example, specific dimensions, orientations, locations, and shapes will be determined in part by the particular intended application and use environment.

In the figures, reference numbers refer to the same or equivalent parts of the present invention throughout the several figures of the drawing.

DETAILED DESCRIPTION

Hereinafter, an exemplary embodiment of the present specification will be described in detail with reference to the accompanying drawings.

In the description of the exemplary embodiment, a description of technical contents, which are well known in the technical field to which the present specification pertains and are not directly relevant to the present specification, will be omitted. The reason is to more clearly provide the subject matter of the present specification without obscuring the subject matter, by omitting the unnecessary descriptions.

For the same reason, some constituent elements are exaggerated, omitted, or schematically illustrated in the accompanying drawings. In addition, a size of each of the constituent elements does not completely reflect a real size. The same or corresponding constituent elements are designated by the same reference numerals in the respective drawings.

Figure 2:
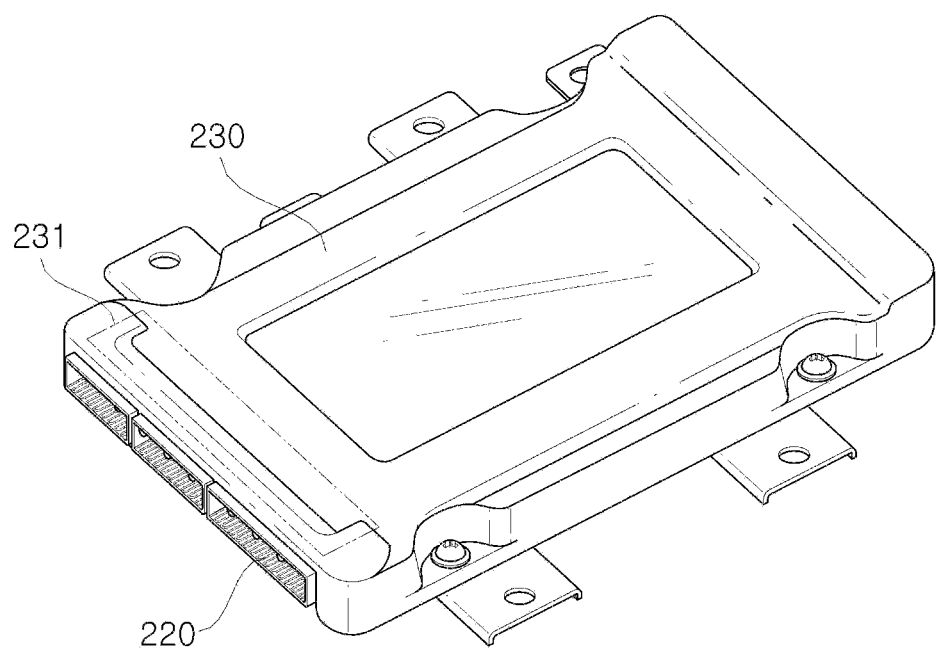
FIG. 2 is a perspective view of an electronic control apparatus for a vehicle according to an exemplary embodiment of the present specification.

FIG. 2 is a perspective view of an electronic control apparatus for a vehicle according to an exemplary embodiment of the present specification.

Figure 3:
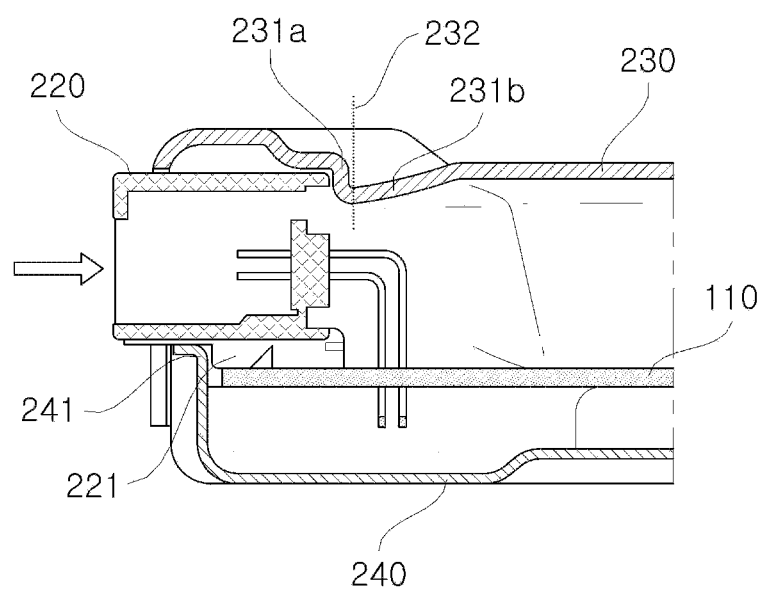
FIG. 3 is a cross-sectional view of the electronic control apparatus for a vehicle according to the exemplary embodiment of the present specification.

FIG. 3 is a cross-sectional view of the electronic control apparatus for a vehicle according to the exemplary embodiment of the present specification.

An electronic control apparatus 200 refers to a component in which an integrated control circuit means such as an electronic control board 110, for example, a printed circuit board (PCB), which electrically controls respective parts in the vehicle, is mounted. Therefore, the electronic control apparatus 200 may have a tight sealing structure for preventing moisture or foreign substances from flowing into the electronic control apparatus 100 from the outside. As an example, the electronic control apparatus 200 may be applied to an electronic control apparatus for a battery management system (BMS) of an environmental vehicle.

The electronic control apparatus 200 may have a heat radiating structure that radiates heat, which is generated from a heat generating element, such as a capacitor, mounted on the electronic control board 110, into the atmosphere, and a housing structure that prevents moisture or foreign substances from flowing into the electronic control apparatus from the outside.

As illustrated in FIG. 2, the electronic control apparatus 200 includes a cover 230 and a base 240 that are vertically combined with each other and accommodate therein the electronic control board 110 such as the PCB. Here, the cover 230 and the base 240 define a housing for accommodating the electronic control board 110. A connector 220 is coupled to a front side of the cover 230 and the base 240 that are combined as described above.

When the cover 230 at the upper side and the base 240 at the lower side are coupled to each other, the connector 220 is also coupled to the cover 230 and the base 240 by being interposed between the cover 230 and the base 240 by means of a rear end body portion.

The cover 230 has an upper support portion 231 that supports an upper portion of the connector 220 when the cover 230 is coupled to the connector 220. The upper support portion 231 may be formed in a drawing shape of a press housing. The upper support portion 231 is formed in a drawing shape which surrounds the upper portion that is in direct contact with the connector 220, and supports the upper portion of the connector 220. Therefore, it is possible to disperse stress that is generated when a socket, a plug or the like is connected to or separated from the connector 220.

Meanwhile, as illustrated in FIG. 3, the electronic control board 110 is mounted between the cover 230 and the base 240. The electronic control board 110 includes an electronic control element which electrically controls respective parts in the vehicle, and a heat generating element which is positioned on one surface of the PCB.

Although not illustrated, a heat radiating plate for radiating heat from the heat generating element may be attached to the other surface of the PCB which is opposite to the one surface on which the heat generating element is positioned. Here, the heat generating element may be positioned at a top side or a bottom side of the PCB. In a case in which the heat generating element is positioned at the top side of the PCB, the heat radiating plate is attached to the bottom side of the PCB. On the contrary, in a case in which the heat generating element is positioned at the bottom side of the PCB, the heat radiating plate is attached to the top side of the PCB.

The connector 220 has connector inner pins, and is coupled to the electronic control board 110.

The cover 230 and the base 240 define therein a predetermined space for accommodating the PCB and various types of components. The cover 230 and the base 240 are constructed to be coupled to each other at ends thereof by means of screws.

Meanwhile, the upper support portion 231 may be formed integrally with the cover 230 by protruding inward from the cover 230. In addition, the upper support portion 231 may be attached to the inside of the cover 230 instead of being formed integrally with the cover 230. Here, the upper support portion 231 may protrude to have a curved surface a drawing shape in which the upper support portion 231 is in direct contact with the upper portion of the connector 220. With the above configuration, the upper support portion 231 may disperse stress that is generated when a socket, a plug or the like is connected to or separated from the upper portion of the connector 220.

The upper support portion 231 disperses unnecessary external force, which may be generated when a socket, a plug or the like is connected to or separated from the connector 220, to the cover 230, thereby preventing the electronic control board 110 from being damaged. Accordingly, it is possible to omit a process of assembling a large number of screws 121 at the time of assembling a plurality of connectors to the general electronic control apparatus 100. That is, the electronic control apparatus 200 including the upper support portion 231 simplifies an assembling process, thereby reducing process costs and material costs, and efficiently reducing costs.

The upper support portion 231 may include a first curved surface 231a and a second curved surface 231b that are separated at both sides based on a vertical surface 232 perpendicular to a direction in which the upper portion of the connector 220 is inserted. The first curved surface 231a and the second curved surface 231b are positioned at both sides based on the vertical surface 232.

Here, the first curved surface 231a is in direct contact with a front surface into which the upper portion of the connector 220 is inserted, and the first curved surface 231a is positioned at one side, for example, at the left side. In addition, the second curved surface 231b is connected with the first curved surface 231b, and positioned at the other side, for example, at the right side. An angle between the vertical surface 232 and the second curved surface 231b is greater than an angle between the vertical surface 232 and the first curved surface 231a. That is, the drawing shape of the upper support portion 231 may be a "V" shape which is raised upward toward the outside of the second curved surface 231b through the first curved surface 231a and the second curved surface 231b which supports the connector 220. In addition to the function of supporting the connector 220, the upper support portion 231 serves to prevent the cover 230 from coming into contact with the inner pin (a leg of a wire) for connecting the connector 220 and the electronic control board 110 when the cover 230 is dented by impact applied to the upper portion of the cover 230, thereby preventing a fire caused by a short-circuit.

Meanwhile, a lower support portion 241 may be formed to extend from the base 240. The lower support portion 241 may be formed to be in direct contact with a lower protruding portion 221 of the connector 220, and the lower protruding portion 221 protrudes in a direction of the electronic control board 110.

Here, an edge surface of the lower support portion 241, which is in direct contact with the lower protruding portion 221 of the connector 220, may be rounded.

Meanwhile, when describing a process of manufacturing the electronic control apparatus 200 according to the exemplary embodiment of the present specification, during the process of manufacturing the electronic control apparatus 200, the electronic control board 110, which includes electronic control elements for electrically controlling respective parts in the vehicle and heat generating elements, is coupled to the connector 220 provided with the connector inner pins. Further, the heat radiating plate (e.g., a metallic material or a heat radiating pad) may be attached to the lower surface of the electronic control board 110 which is opposite to the upper surface on which the heat generating element is positioned.

Thereafter, the electronic control board 110 is inserted between the cover 230 and the base 240, and a necessary number of screws are fastened to ends of the cover 230 and the base 240.

As described above, according to the electronic control apparatus 200 according to the exemplary embodiment of the present specification, it is possible to support the connector 220 without using an adhesive or a screw in a state in which no structure for preventing the connector 220 from being pushed is provided in the housing. In addition, the electronic control apparatus 200 according to the exemplary embodiment of the present specification may more safely prevent damage to the electronic control board 110 and the connector 220 without using an additional separate structure, as compared to the case in which an adhesive or a screw is used.

In this case, according to the electronic control apparatus 100 for a vehicle which uses a housing manufactured by using a general press, the connector 120 is fixed to the electronic control board 110 by the screw 121 or the connector 120 is fixed by using an adhesive, in order to disperse stress which is generated when a socket, a plug or the like is connected to or separated from the connector 120. Therefore, the number of screws 121 to be fastened or the amount of adhesive to be used is increased.

However, according to the exemplary embodiment of the present specification, the connector 220 is supported by the upper support portion 231 and the lower support portion 241. Therefore, stress, which is generated when a socket, a plug or the like is connected to or separated from the connector 220, is dispersed. Accordingly, it is possible to reinforce strength of the housing, thereby reducing the number of screws to be fastened. For example, six screws are required to couple the cover 130 and the base 140 of the general electronic control apparatus 100, but in a case in which the support structure described in the present specification is applied, there is an advantage in that the cover 230 and the base 240 need only to be fastened by four screws.

As described above, the exemplary embodiments have been described and illustrated in the drawings and the specification. The exemplary embodiments were chosen and described in order to explain certain principles of the invention and their practical application, to thereby enable others skilled in the art to make and utilize various exemplary embodiments of the present invention, as well as various alternatives and modifications thereof As is evident from the foregoing description, certain aspects of the present invention are not limited by the particular details of the examples illustrated herein, and it is therefore contemplated that other modifications and applications, or equivalents thereof, will occur to those skilled in the art. Many changes, modifications, variations and other uses and applications of the present construction will, however, become apparent to those skilled in the art after considering the specification and the accompanying drawings. All such changes, modifications, variations and other uses and applications which do not depart from the spirit and scope of the invention are deemed to be covered by the invention which is limited only by the claims which follow.

What is claimed is:

1. An electronic control apparatus for a vehicle, comprising:
    an electronic control board which electrically controls respective parts in the vehicle;
    a connector which is electrically connected with the electronic control board; and
    a housing which is provided with a cover and a base in order to accommodate the electronic control board,
    wherein the connector is coupled to the cover and the base by being interposed between the cover and the base,
    wherein the cover includes an upper support portion which supports an upper portion of the connector, and the base includes a lower support portion which supports a lower portion of the connector, and
    wherein the upper support portion has a first curved surface being positioned at one side so as to be in contact with a front surface into which the upper portion of the connector is inserted, and a second curved surface being positioned at the other side so as to be connected with the first curved surface.

2. The electronic control apparatus of claim 1, wherein the upper support portion is formed integrally with the cover so as to protrude inward from the cover.

3. The electronic control apparatus of claim 1, wherein the upper support portion protrudes to have a curved surface so as to have a drawing shape in which the upper support portion is in direct contact with the upper portion of the connector.

4. The electronic control apparatus of claim 1, wherein the first curved surface and the second curved surface which are positioned at both sides based on a vertical surface perpendicular to a direction in which the upper portion of the connector is inserted, and an angle between the vertical surface and the second curved surface is greater than an angle between the vertical surface and the first curved surface.

5. The electronic control apparatus of claim 1, wherein the lower support portion is formed to extend from the base so as to support a lower end of the connector.

6. The electronic control apparatus of claim 1, wherein the lower support portion is formed to be in direct contact with a lower protruding portion of the connector, which protrudes in a direction of the electronic control board.

7. The electronic control apparatus of claim 6, wherein an edge surface of the lower support portion, which is in direct contact with the lower protruding portion of the connector, is rounded.

* * * * *